(12) United States Patent
Ohkuri et al.

(10) Patent No.: US 7,221,297 B2
(45) Date of Patent: May 22, 2007

(54) D/A CONVERTER AND OUTPUT AMPLIFYING CIRCUIT

(75) Inventors: Kazunobu Ohkuri, Kanagawa (JP); Toshihiko Masuda, Tokyo (JP)

(73) Assignee: Sony Corporation, Tokyo (JP)

( * ) Notice: Subject to any disclaimer, the term of this patent is extended or adjusted under 35 U.S.C. 154(b) by 834 days.

(21) Appl. No.: 10/250,325

(22) PCT Filed: Oct. 23, 2002

(86) PCT No.: PCT/JP02/11014

§ 371 (c)(1),
(2), (4) Date: Jun. 30, 2003

(87) PCT Pub. No.: WO03/039007

PCT Pub. Date: May 8, 2003

(65) Prior Publication Data

US 2004/0051654 A1    Mar. 18, 2004

(30) Foreign Application Priority Data

Oct. 29, 2001   (JP)   ............................. 2001-330557

(51) Int. Cl.
*H03M 1/10* (2006.01)

(52) U.S. Cl. ................... 341/120; 341/118; 341/143; 341/144; 341/152; 330/10; 330/207 A; 330/251

(58) Field of Classification Search ................. 341/152
See application file for complete search history.

(56) References Cited

U.S. PATENT DOCUMENTS 5,548,286 A * 8/1996 Craven ...................... 341/126
6,147,634 A * 11/2000 Rangan et al. ............. 341/143
6,198,416 B1   3/2001 Velazquez
6,292,122 B1 * 9/2001 Younis et al. ............... 341/143
6,373,334 B1 * 4/2002 Melanson ..................... 330/10
6,765,436 B1 * 7/2004 Melanson et al. ............ 330/10

FOREIGN PATENT DOCUMENTS

| JP | 02-200012 A | 8/1990 |
| JP | 02200012    | 8/1990 |
| JP | 03-060222 A | 3/1991 |
| JP | 07-022861 A | 1/1995 |

OTHER PUBLICATIONS

Supplementary European Search Report EP02802369, Mar. 01, 2005.

* cited by examiner

*Primary Examiner*—Khai M. Nguyen
(74) *Attorney, Agent, or Firm*—Wolf, Greenfield & Sacks, P.C.

(57) ABSTRACT

A D/A converter in which distortion caused by PWM is favorably removed even if a sampling frequency is low relative to a signal frequency is provided. The D/A converter includes a pulse-width-modulated-signal outputting circuit for outputting a pulse-width-modulated signal having a pulse width in accordance with a digital value of an input digital signal. A distortion-correcting-component generating circuit (3) for generating from the input digital signal at least a correcting component corresponding to a distortion component generated in the pulse-width-modulated-signal outputting circuit; a subtractor circuit (2) disposed at an upstream of the pulse-width-modulated-signal outputting circuit, for subtracting the correcting component generated by the distortion-correcting-component generating circuit from the input digital signal; and a phase correcting circuit (10) for correcting phase characteristics of the input digital signal so that the distortion component and the correcting component have a phase difference such that these components have opposite phases in the pulse-width-modulated-signal outputting circuit; are provided.

7 Claims, 9 Drawing Sheets

PRIOR ART

D/A CONVERTER AND OUTPUT AMPLIFYING CIRCUIT

This application is a 371 of PCT/JP02/11014 filed Oct. 23, 2002 which claims priority to Japan application No. 2001-330552 which filed Oct. 29, 2001.

TECHNICAL FIELD

The present invention relates to a D/A converter, a digital signal processing apparatus, and a digital signal processing method that are suitable for use with, for example, digital audio signals.

BACKGROUND ART

A type of D/A converter that includes a pulse-width-modulated-signal outputting circuit for outputting a pulse-width-modulated (PWM) signal having a pulse width in accordance with a digital value of a digital signal has been known. It is also known that, in this type of D/A converter, a harmonic distortion of a playback signal component (a playback signal, here and hereafter, refers to an analog signal that is to be obtained by D/A conversion) occurs (Reference Document 1; Karsten Nielsen: "A Review and Comparison of Pulse Width Modulation (PWM) Method For Analog and Digital Input Switching Power Amplifiers", $102^{nd}$ AES convention 1997 Mar. 22-25 Preprint).

As an example of a method of removing the harmonic distortion mentioned above, a D/A converter disclosed in Reference Document 2 (Japanese Unexamined Patent Application Publication No. 2-200012 (Japanese Patent Publication No. 8-28667)) is known.

The D/A converter disclosed in Reference Document 2 has an arrangement shown in FIG. 10. That is, an input digital audio signal Di having, for example, 24 bits, input via an input terminal 1, is directly supplied to a subtractor circuit 2 and also to a distortion-correcting-component generating circuit 3.

The distortion-correcting-component generating circuit 3 generates a distortion-correcting component Dn corresponding to a harmonic distortion of a playback signal component, generated in a PWM circuit 5, which will be described later. The distortion-correcting-component generating circuit 3 supplies the distortion-correcting component Dn generated to the subtractor circuit 2, where the distortion-correcting component Dn is subtracted from the input digital signal Di. Alternatively, an adder circuit may be provided instead of the subtractor circuit 2, inverting the distortion-correcting component Dn from the distortion-correcting-component generating circuit 3 before supplying it to the adder circuit.

The digital audio signal (24 bits) from the subtractor circuit 2 is supplied to a Δ-Σ modulating circuit 4, where the number of bits is reduced while localizing quantization noise to a high-frequency side. For example, the Δ-Σ modulating circuit 4 performs third-order noise shaping on the 24-bit digital audio signal from the subtractor circuit 2, outputting a digital signal having 3 to 8 bits.

The digital signal output from the Δ-Σ modulating circuit 4 is supplied to the PWM circuit 5 constituting a D/A converter section. The PWM circuit 5 outputs a PWM signal having a pulse width in accordance with a digital value of the digital signal received having 3 to 8 bits.

The PWM circuit 5 outputs a PWM signal having a pulse width in accordance with the number of bits of the signal input thereto. For example, if the digital signal received has three bits, the PWM circuit 5 outputs a PWM signal having one of seven pulse widths in accordance with a digital value of the digital signal. FIG. 3 shows, as an example, a case of double-side modulated PWM signals. As described earlier, in the PWM circuit 5, a harmonic distortion of a playback signal component occurs. In particular, a second harmonic distortion is the largest.

The distortion-correcting-component generating circuit 3 generates a correcting component Dn corresponding to the harmonic distortion generated in the PWM circuit 5, and subtracts the correcting component Dn from the input digital signal Di in advance. Then, the harmonic distortion generated in the PWM circuit 5 is cancelled by the correcting component Dn subtracted in advance. Thus, the PWM circuit 5 outputs a PWM signal in which the harmonic distortion has been removed.

The PWM signal output from the PWM circuit 5 is supplied to a speaker via a power amplifier (output amplifier circuit) implemented by, for example, a class-D amplifier, whereby a sound is played back. The class-D amplifier includes switching elements, and switching of the switching elements is driven by the PWM signal.

According to an equation disclosed in Reference Document 1 mentioned earlier, in an output of a double-side modulated PWM signal, phase characteristics of the harmonic distortion of the playback signal component does not depend on the frequency of input signal.

However, as will be described later, the inventors have verified that the phase characteristics of the harmonic distortion component depend on normalized frequency defined as (normalized frequency)=(frequency of playback signal)/(sampling frequency), and that, in the arrangement of the D/A converter according to the related art shown in FIG. 10, although a certain effect of correction is achieved when normalized frequency is low, conversely, the distortion component could be intensified when normalized frequency is high.

In particular, when a PWM signal obtained by D/A conversion of a digital audio signal is supplied to a speaker via a class-D amplifier for acoustic playback as described above, generally, in the class-D amplifier, switching devices are operated at a high voltage and a large output current is required, inhibiting a high switching frequency (sampling frequency).

Thus, when the class-D amplifier is driven by a PWM signal, the sampling frequency must be low, so that normalized frequency of a signal in the audible band (playback signal) becomes high. Accordingly, the correcting method by the circuitry according to the related art shown in FIG. 10 does not correct a harmonic distortion effectively.

The present invention has been made in view of the above, and an object thereof is to provide a D/A converter and a digital signal processing apparatus that favorably remove a distortion even when normalized frequency is high.

DISCLOSURE OF INVENTION

In order to overcome the problem described above, a D/A converter according to the present invention includes a pulse-width-modulated-signal outputting circuit for outputting a pulse-width-modulated signal having a pulse width in accordance with a digital value of an input digital signal;

a correcting-component generating circuit for generating, from the input digital signal, at least a correcting component corresponding to a distortion component generated in the pulse-width-modulated-signal outputting circuit;

a subtractor circuit disposed at an upstream of the pulse-width-modulated-signal outputting circuit, for subtracting, from the input digital signal, the correcting component generated by the correcting-component generating circuit; and a phase correcting circuit for correcting amplitude-phase characteristics of the input digital signal so that the distortion component and the correcting component have a phase difference such that these components have opposite phases in the pulse-width-modulated-signal outputting circuit.

According to the arrangement of the present invention, the amplitude-phase characteristics of the input digital signal are corrected so that, regardless of normalized frequency, the distortion component generated in the pulse-width-modulation outputting circuit and the correcting component generated in the correcting-component generating circuit have a phase difference such that these components have opposite phases. Accordingly, the distortion component is favorably removed even when normalized frequency is high.

BEST MODE FOR CARRYING OUT THE INVENTION

Now, a digital signal processing apparatus and a D/A converter according to embodiments of the present invention will be described with reference to the drawings.

Figure 1:
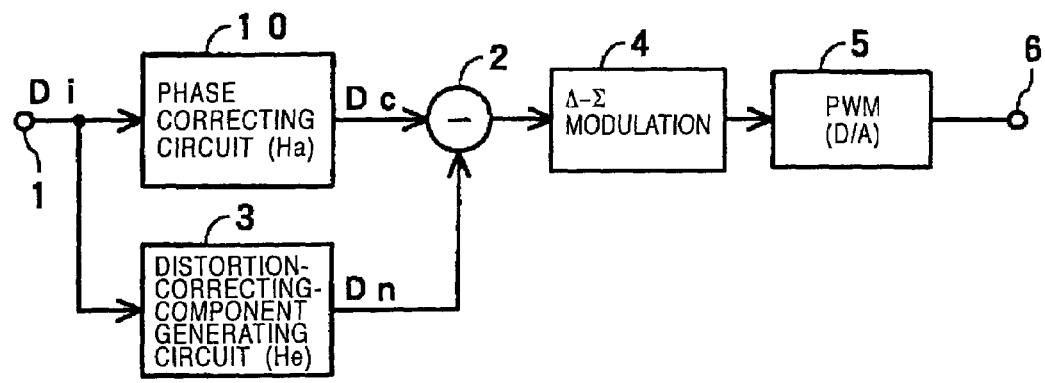
FIG. 1 is a diagram showing an example configuration of a D/A converter according to an embodiment of the present invention.
Figure 10:
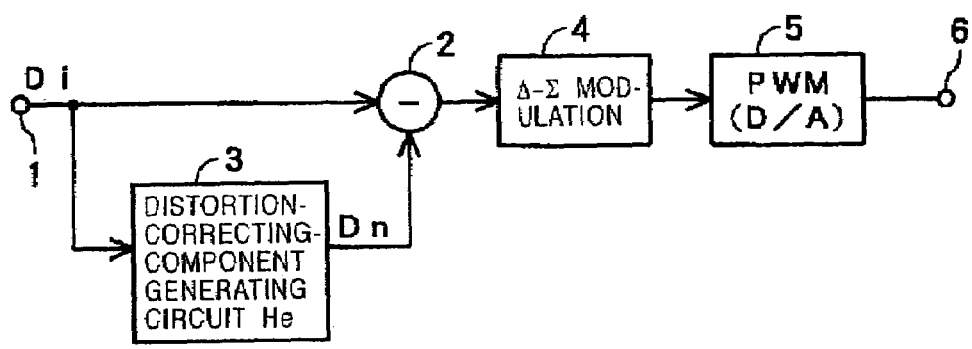
FIG. 10 is a diagram showing an example of a D/A converter according to the related art.

FIG. 1 is a block diagram of a D/A converter according to an embodiment of the present invention. In this embodiment, the present invention is applied to the example shown in FIG. 10, described earlier, and the same parts as those in the example shown in FIG. 10 are denoted by the same numerals.

In the example shown in FIG. 1, an input digital audio signal Di having, for example, 24 bits, input via an input terminal 1, is supplied to a phase correcting circuit 10 and to a distortion-correcting-component generating circuit 3.

The phase correcting circuit 10 corrects amplitude-phase characteristics of the input digital audio signal Di so that a harmonic distortion component of a playback signal corresponding to the input digital audio signal Di, generated in a PWM circuit 5, substantially coincides with a correcting component generated by the distortion-correcting-component generating circuit 3, regardless of normalized frequency. That is, the transfer function Ha of the phase correcting circuit 10 is determined so that the above relationship is satisfied. Then, the phase correcting circuit 10 supplies a digital audio signal Dc having corrected amplitude-phase characteristics to a subtractor circuit 2.

The distortion-correcting-component generating circuit 3, as described above, generates a distortion-correcting component Dn corresponding to the harmonic distortion of the playback signal component, generated in the PWM circuit 5, and supplies the distortion-correcting component Dn generated to the subtractor circuit 2.

The subtractor circuit 2 subtracts the distortion-correcting component Dn supplied from the distortion-correcting-component generating circuit 3 from the digital signal Dc supplied from the phase correcting circuit 10. It is equivalent to provide an adder circuit instead of the subtractor circuit 2 and to invert the distortion-correcting component Dn from the distortion-correcting-component generating circuit 3 before supplying it to the adder circuit.

The digital audio signal (24 bits) from the subtractor circuit 2 is supplied to the PWM circuit 5 via a Δ-Σ modulating circuit 4, similarly to the example shown in FIG. 10. That is, the arrangement shown in FIG. 1 differs from the arrangement of the example shown in FIG. 10 only in that the phase correcting circuit 10 is disposed between the input terminal 1 and the subtractor circuit 2, and is otherwise the same as the arrangement of the example shown in FIG. 10.

Figure 2:
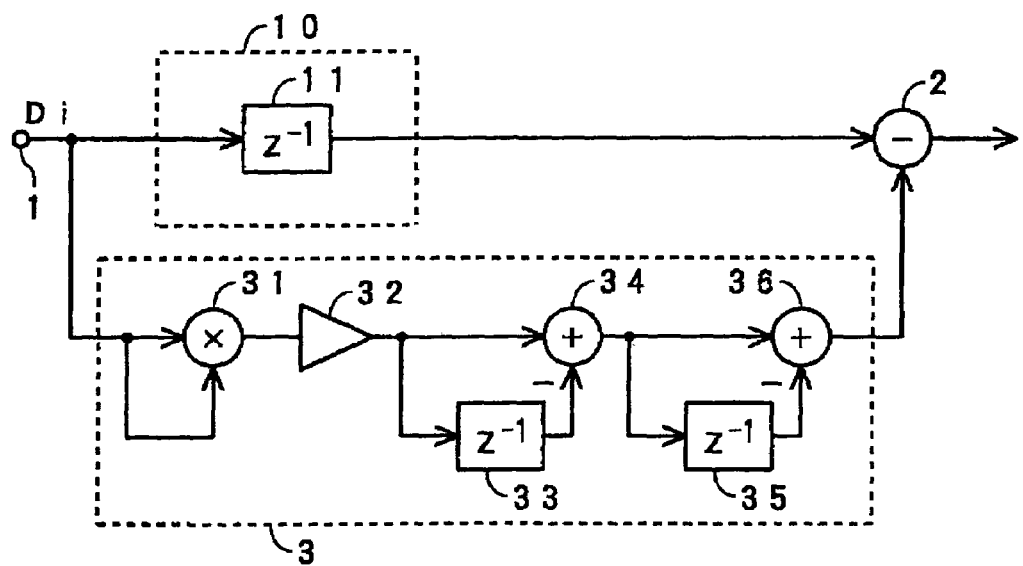
FIG. 2 is a diagram showing a specific example of a part of the circuitry shown in FIG. 1.

FIG. 2 shows a specific example of configurations of the phase correcting circuit 10 and the distortion-correcting-component generating circuit 3 that are used in a case where a second harmonic distortion of a playback signal, generated in the PWM circuit 5, is to be removed.

More specifically, in this example, the phase correcting circuit 10 includes a delaying circuit 11 for causing a delay corresponding to one sample of the input digital audio signal Di.

Thus, the transfer function Ha of the phase correcting circuit 10 in this example is:

$$Ha = Z^{-1}$$

where $Z^{-1}$ represents a delay of sample by Z function.

The distortion-correcting-component generating circuit 3 includes a multiplier 31, an amplifier 32, one-sample delaying circuits 33 and 35, and subtractor circuits 34 and 36. The multiplier circuit 31 squares the input digital audio signal Di, and supplies the result to the one-sample delaying circuit 33 and the subtractor circuit 34 via the amplifier 32.

The subtractor circuit 34 subtracts an output of the one-sample delaying circuit 33 from the output of the multiplier 31, and supplies the result of subtraction to the one-sample delaying circuit 35 and the subtractor circuit 36. The subtractor circuit 36 subtracts an output of the one-sample delaying circuit 35 from the output of the subtractor circuit 34, obtaining a distortion-correcting component Dn as a result of subtraction. Then, the distortion-correcting component Dn is supplied to the subtractor circuit 2.

The transfer function He of the distortion-correcting-component generating circuit 3 can be expressed as:

$$He = \alpha x^2 \cdot (1 - Z^{-1})^2$$

where $\alpha$ is a constant, x is the value of the input digital signal, and $Z^{-1}$ represents a delay of one sample by Z function.

Figure 3:
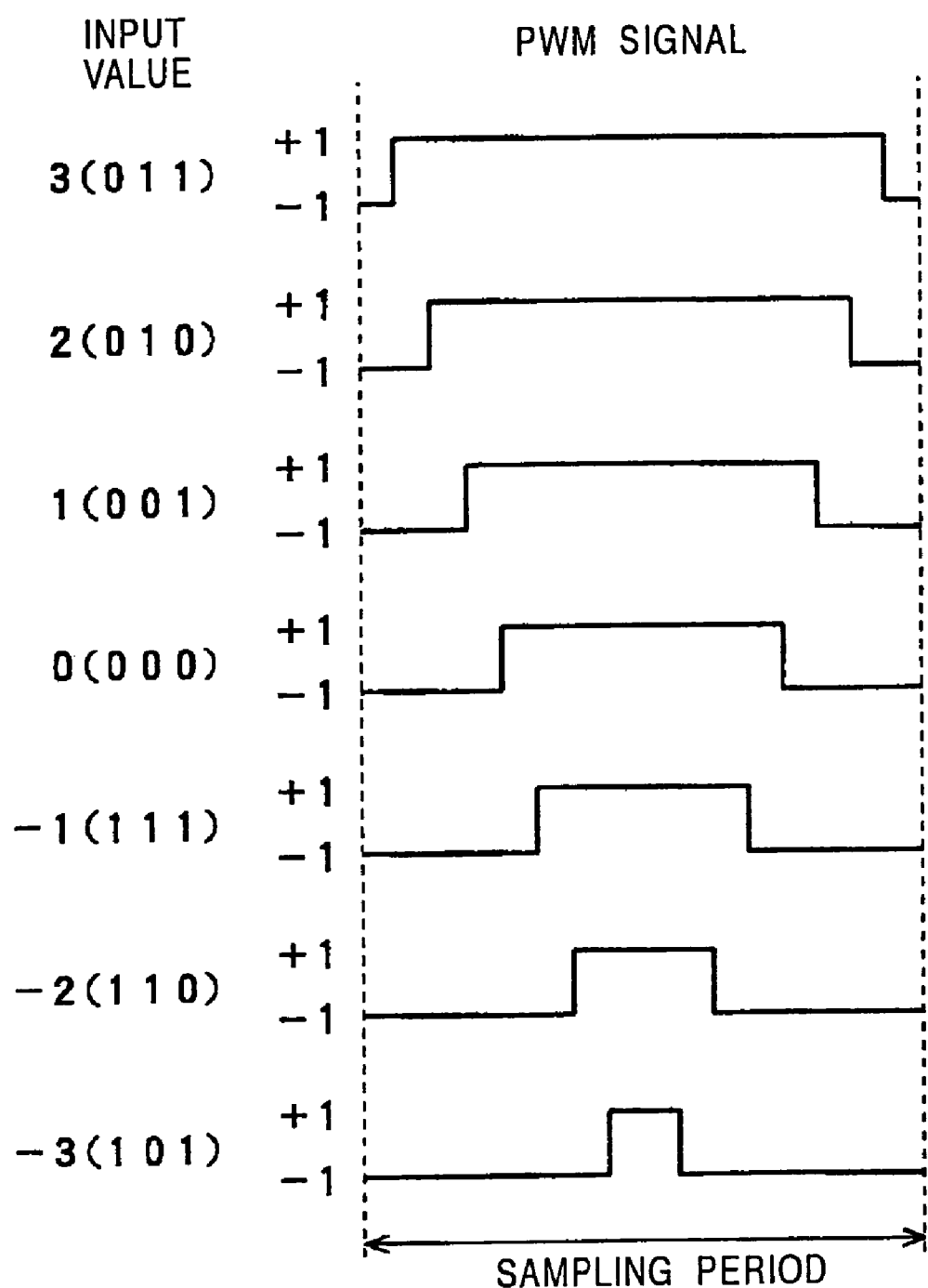
FIG. 3 is a diagram for explaining a signal output from a PWM circuit constituting a D/A converter section.

The PWM circuit 5, as described earlier, outputs a PWM signal having a pulse width in accordance with a digital value of a digital signal input thereto. As an example of PWM signals output from the PWM circuit 5, FIG. 3 shows double-side modulated PWM signals having three bits and seven values. In the PWM circuit 5, a harmonic distortion of a playback signal component is generated, and in particular, the second harmonic distortion is the largest.

Figure 4:
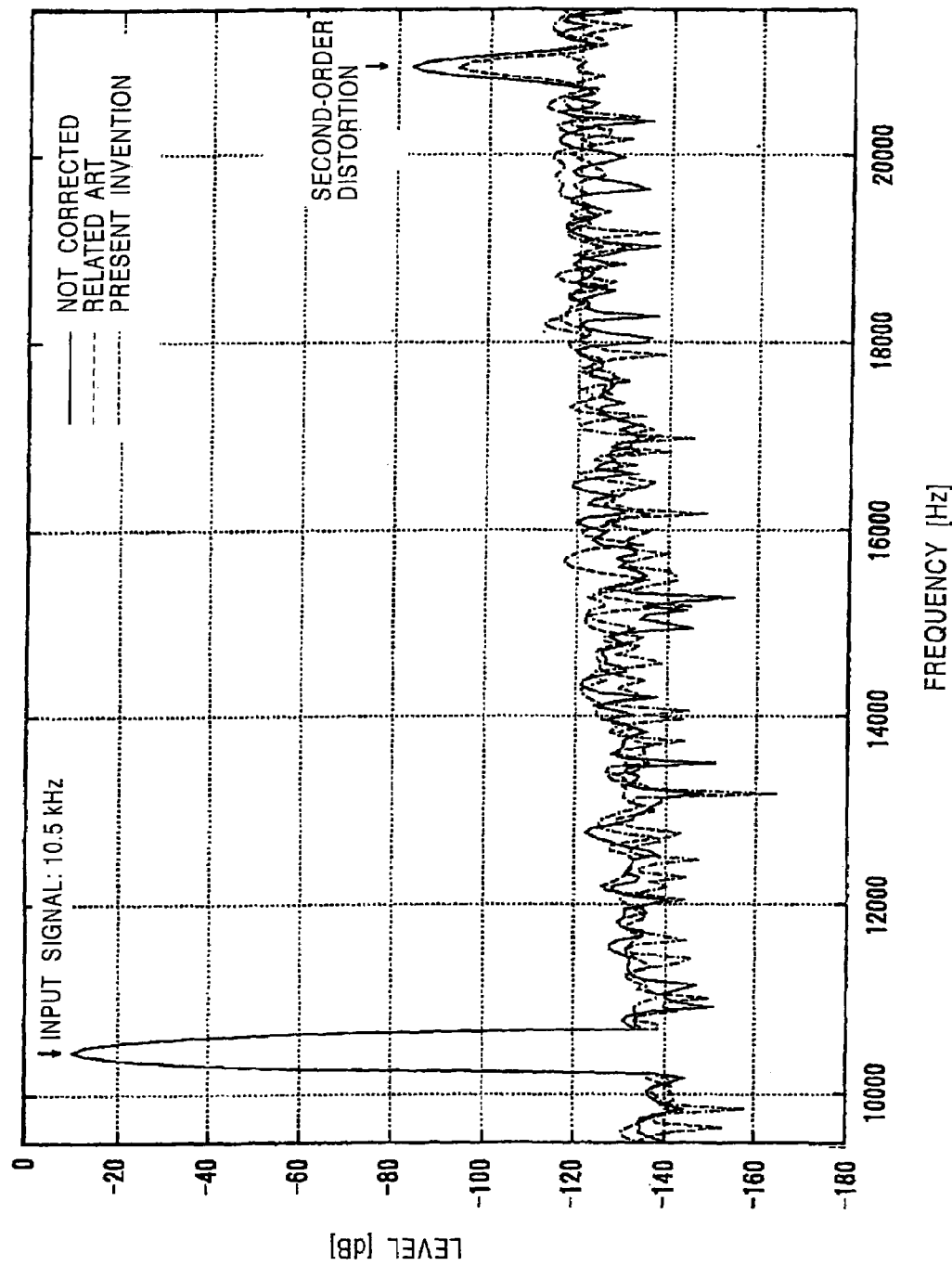
FIG. 4 is a spectrum chart for comparing an output of the D/A converter according to the present invention with that of a related art.

According to the arrangement shown in FIGS. 1 and 2, described above, even when normalized frequency is high, the second harmonic distortion of a playback signal component, generated in the PWM circuit 5, is sufficiently suppressed. FIG. 4 shows a spectrum in a case where an audio signal having a signal frequency of 10.5 kHz is sampled at a sampling frequency of 768 kHz to form a digital signal and the digital signal is converted into an analog signal. FIG. 4 shows results obtained by a computer simulation. As the Δ-Σ modulating circuit 4, a circuit that performs third-order noise shaping with input data having 24 bits and output data having 6 bits was used.

In FIG. 4, the spectrum of an output of D/A conversion without correction is indicated by a solid line. The spectrum of an output of D/A conversion in the case of the related art shown in FIG. 10 is indicated by a dotted line. The spectrum of an output of D/A conversion in the example according to the present invention, shown in FIGS. 1 and 2, is indicated by a dashed line.

As shown in FIG. 4, when normalized frequency is high as in this simulation, the amount of reduction in the second-order distortion is small and a large amount of second-order distortion remains in the case of the related art shown in FIG. 10. On the other hand, in the example according to the present invention, shown in FIGS. 1 and 2, the second-order distortion is reduced and substantially eliminated.

Figure 5:
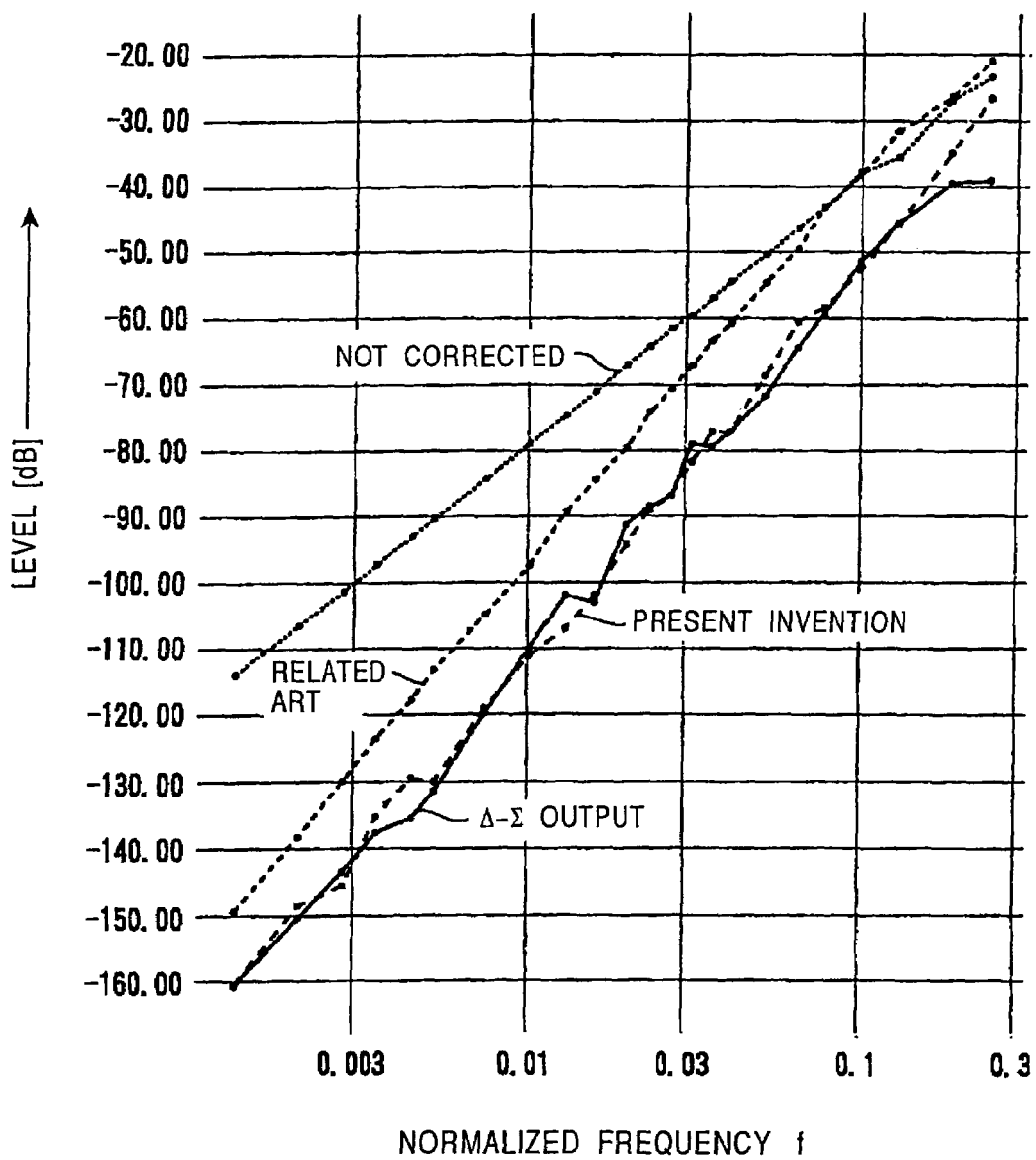
FIG. 5 is a diagram showing characteristics of the magnitude of a second harmonic distortion in relation to the frequency of input signal (frequency of playback signal).

FIG. 5 is a graph showing characteristics of the magnitude of a second-order harmonic distortion in relation to the frequency of input signal (frequency of playback signal), obtained by a computer simulation carried out under the same conditions as above. In FIG. 5, the horizontal axis represents normalized frequency, and the vertical axis represents ratio of spectral magnitude of second harmonic wave to frequency components of playback signal.

According to the graph shown in FIG. 5, although the effect of suppressing second-order distortion exists even in the case of the related art shown in FIG. 10, the effect is very large in the example according to the present invention, shown in FIGS. 1 and 2. Furthermore, when normalized frequency is high, the second harmonic component is intensified in the case of the related art shown in FIG. 10. On the other hand, in the example according to the present invention, shown in FIGS. 1 and 2, the second-order distortion is suppressed even when normalized frequency is high.

Furthermore, characteristics of output of the Δ-Σ modulating circuit 4 are also shown in the graph in FIG. 5. The output of the PWM circuit 5 in the example according to the present invention, shown in FIGS. 1 and 2, is close to the output of the Δ-Σ modulating circuit 4. That is, it is understood that the second harmonic distortion generated in the PWM circuit 5 is substantially eliminated.

Next, reasons why the method according to the present invention and the method according to the related art shown in FIG. 10 exhibit difference of effect as described above will be considered.

The inventors performed a computer simulation to calculate phase characteristics of a second-order distortion generated by PWM in the PWM circuit 5 in relation to an input digital signal, a second-order distortion generated by PWM in the PWM circuit 5 in relation to a digital signal coming through the phase correcting circuit 10 in the example shown in FIG. 1, and of a signal component obtained by PWM in the PWM circuit 5 of a distortion correcting component generated by the distortion-correcting-component generating circuit 3.

Figure 6:
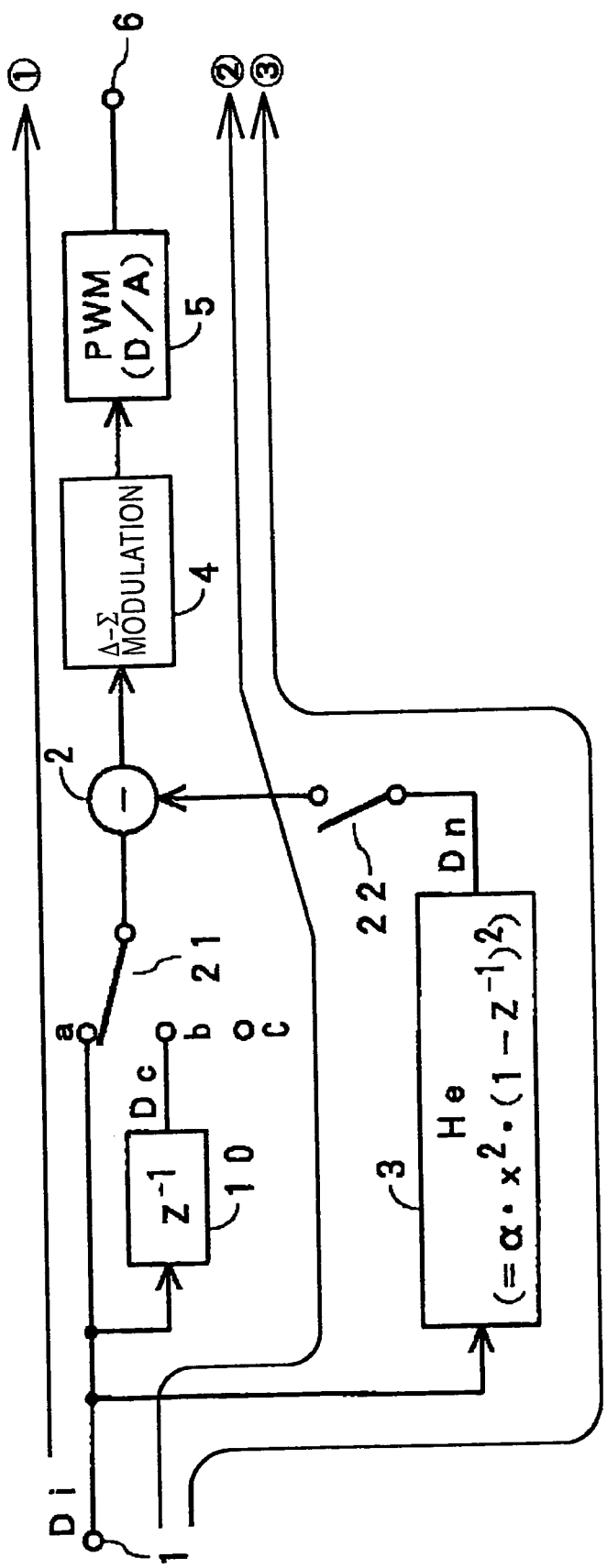
FIG. 6 is a diagram showing an arrangement for a simulation for explaining the present invention.

FIG. 6 is a diagram showing an arrangement that was used for the computer simulation. More specifically, referring to FIG. 6, in addition to the arrangement shown in FIG. 1, a selecting switch 21 for selecting the input, digital signal Di from the input terminal 1 or the digital signal Dc from the phase correcting circuit 10 as a signal to be supplied to the subtractor circuit 2 was provided, and an on-off switch 22 was provided between the distortion-correcting-component generating circuit 3 and the subtractor circuit 2.

In FIG. 6, phase characteristics of second-order distortions in relation to the three paths described above were calculated. More specifically, phase characteristics of a second-order distortion that is generated by PWM in the PWM circuit 5 in relation to the input digital signal Di were calculated with the switch 21 connected to a contact a for selecting the input digital signal Di from the input terminal 1 and with the switch 22 turned off (path ① in FIG. 6).

Also, phase characteristics of a second-order distortion generated by PWM in the PWM circuit 5 in relation to the digital signal Dc whose phase has been corrected were calculated with the switch 21 connected to a contact b for selecting the digital signal Dc whose phase has been corrected from the phase correcting circuit 10 and with the switch 22 turned off (path ② in FIG. 6).

Also, phase characteristics of a signal generated by PWM in the PWM circuit 5 of the distortion-correcting component Dn from the distortion-correcting-component generating circuit 3 were calculated with the switch 21 connected to an open terminal c and with the switch 22 turned on (path ③ in FIG. 6).

Figure 7:
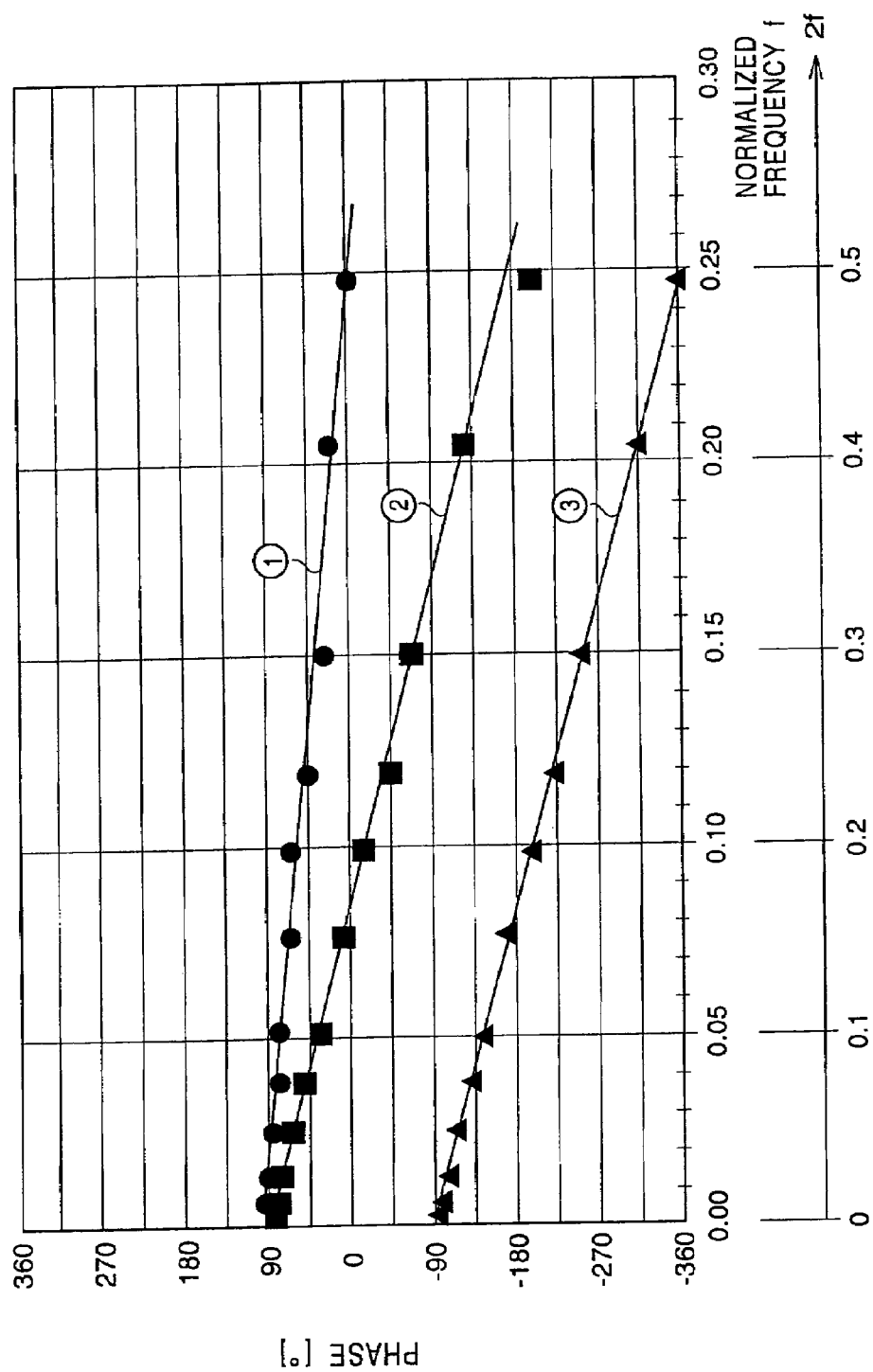
FIG. 7 is a diagram showing phase characteristics obtained by the simulation of FIG. 6.

FIG. 7 shows results of analysis with regard to the three paths described above. Referring to FIG. 7, ① indicates phase characteristics of a second-order distortion component caused by PWM in relation to the input digital signal Di on the path ①, calculated by the simulation. ② indicates phase characteristics of a second-order distortion caused by PWM in relation to the digital signal Dc coming from the phase correcting circuit 10 through the path ②, calculated by the simulation. ③ indicates phase characteristics of a signal obtained by PWM of the distortion-correcting element Dn coming from the distortion-correcting-component generating circuit 3 through the path ③, calculated by the simulation.

In the simulation, normalized frequency that assumes a sampling frequency of 1 was used. As the input digital signal Di, sine-wave data with a sample number of 8,192 was used. Furthermore, as the Δ-Σ modulating circuit 4, a third-order shaping Δ-Σ modulator with 6-bit and 63-value output was used, and double-sided PWM was performed in the PWM circuit 5.

In FIG. 7, since phase characteristics of a second harmonic wave (2f) with respect to the normalized frequency f of a playback signal are shown, an axis of playback signal (normalized frequency f) and an axis of second harmonic component (2f) are shown.

It is understood from FIG. 7 that the second harmonic wave added by PWM to the input digital signal Di has phase characteristics expressed as:

$$P1 = \pi/2 - 2\pi f \qquad (1)$$

with respect to the normalized frequency f (=(frequency of playback signal)/(sampling frequency)) (①  in FIG. 7).

On the other hand, the phase characteristics of the signal obtained by double-sided PWM of the second-order distortion-correcting component generated by the distortion-correcting-component generating circuit 3 can be expressed as:

$$P3 = -\pi/2 - 6\pi f \quad (2)$$

(② in FIG. 7)

In the method according to the related art shown in FIG. 10, the second-order distortion having the phase characteristics P1 is to be corrected by a correcting component having the phase characteristics P3. If the normalized frequency f≈0, P1-P3≈π, so that components having opposite phases are added to cancel the distortion in the PWM circuit 5.

As the normalized frequency becomes higher, however, as shown in FIG. 7, the phase difference between the second-order distortion having the phase characteristics P1 and the correcting component having the phase characteristics P3 deviates from π, so that the distortion is intensified instead of being cancelled. This is also shown in FIG. 5, described earlier, in which the second-order distortion component becomes larger at or above f≈0.125 compared with a case where correction is not performed in the case of the related art.

On the other hand, in the method according to the embodiment, shown in FIGS. 1 and 2, the input digital signal Di is delayed by one sample in the phase correcting circuit 10 before being supplied to the subtractor circuit 2, so that phase characteristics of the second harmonic wave added by PWM of the corrected digital signal component Dc from the phase correcting circuit 10 can be expressed as:

$$P2 = \pi/2 - 6\pi f \quad (3)$$

Thus, from equations (2) and (3) given above, the phase difference between the second-order distortion component having the phase characteristics P2 and the correcting component having the phase characteristics P3 is P2-P3=π regardless of the normalized frequency f. Therefore, in the method 2 according to the embodiment shown in FIGS. 1 and 2, the second-order distortion is fully cancelled in the PWM circuit 5.

According to the equation in the Reference Document 1 mentioned at the beginning, phase characteristics of a harmonic distortion component do not depend on the frequency of input signal in double-sided PWM. However, the inventors have found, through the computer simulation described above, that phase characteristics of a harmonic distortion component are as indicated by ③ in FIG. 7 considering cases where the normalized frequency f is high.

In view of the above, according to the present invention, phase characteristics of an input digital signal are controlled in accordance with phase characteristics of a distortion component, which has not been considered in the method according to the related art.

Accordingly, even if the normalized frequency is high, a harmonic distortion caused by PWM is favorably cancelled, as shown in FIGS. 4 and 5.

OTHER EMBODIMENTS

Although the Δ-Σ modulating circuit 4 is provided in the embodiment shown in FIG. 1 in order to reduce the number of bits supplied to the PWM circuit 5, the Δ-Σ modulating circuit 4 need not be provided.

Furthermore, when a Δ-Σ modulating circuit is provided, the Δ-Σ modulating circuit may be provided at an upstream of the phase correcting circuit 10 and the distortion-correcting-component generating circuit 3. Furthermore, the phase correcting circuit 10 and the distortion-correcting-component generating circuit 3 may be formed within the Δ-Σ modulating circuit.

Furthermore, although a second harmonic distortion is removed among distortions generated in the PWM circuit 5 in the example shown in FIG. 2, obviously, the present invention may be applied to a case where a harmonic distortion of an order other than the second order is to be removed. It is to be understood that, in that case, the transfer function He of the distortion-correcting-component generating circuit 3 and the transfer function Ha of the phase correcting circuit 10 are chosen in accordance with an order of a harmonic distortion to be removed.

Figure 8:
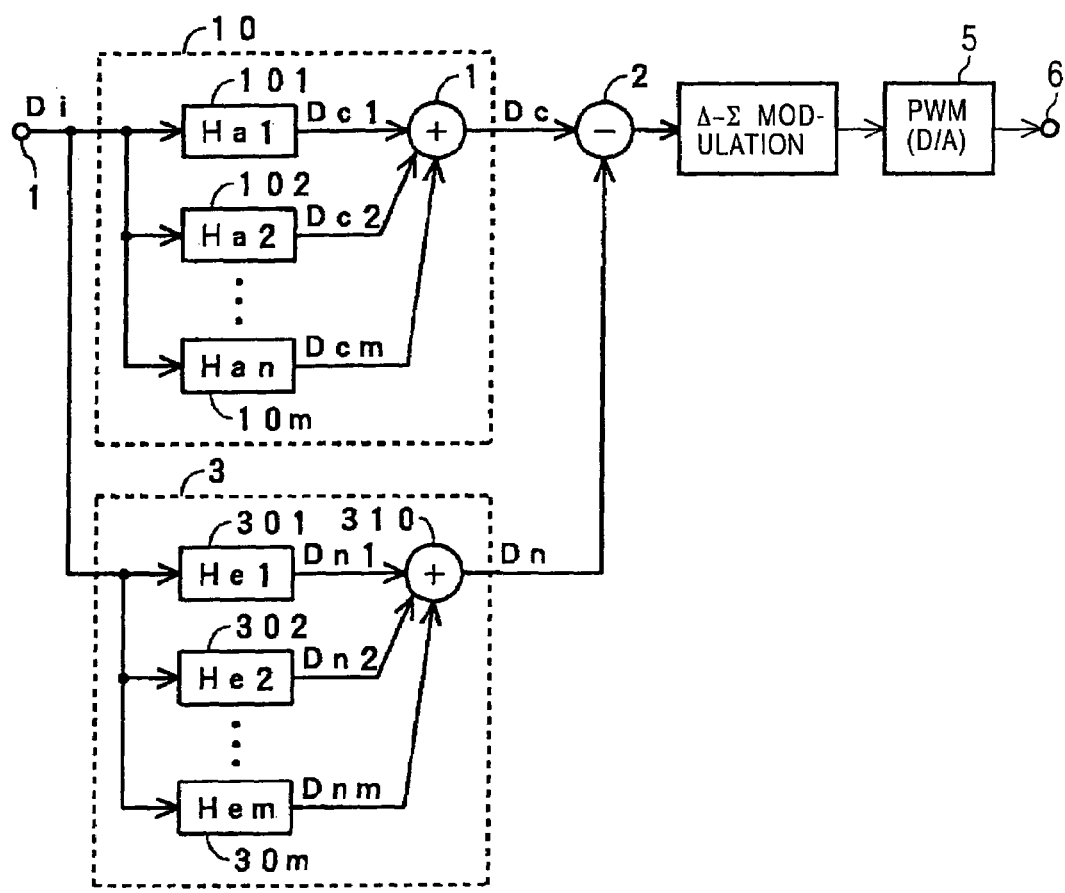
FIG. 8 is a diagram showing an example configuration according to another embodiment of the present invention.

Furthermore, the present invention may be applied to a case where a plurality of harmonic distortions is to be removed. FIG. 8 shows an example configuration of a D/A converter that is used in that case.

More specifically, in the example shown in FIG. 8, the distortion-correcting-component generating circuit 3 includes distortion-correcting-component generating units 301, 302, and . . . 30m for generating distortion-correcting components corresponding to m (m is an integer not smaller than two) n-th harmonic distortions, e.g., second-order distortion and third-order distortion, etc., respectively. The distortion-correcting-component generating units 301, 302, . . . and 30m have transfer functions He1, He2, . . . and Hem for generating distortion-correcting components Dn1, Dn2, . . . and Dnm for removing, from a digital signal Di input from the input terminal 1, harmonic distortions of associated orders among m orders of harmonic distortions generated in the PWM circuit 5, respectively.

The distortion-correcting components Dn1, Dn2, . . . and Dnm from the respective distortion-correcting-component generating units 301, 302, . . . and 30m are supplied to an adder circuit 310. The adder circuit 310 adds the m distortion-correcting components Dn1, Dn2, . . . and Dnm to generate a distortion-correcting component Dn, and supplies the distortion-correcting component Dn to the subtractor circuit 2, where the distortion-correcting component Dn is subtracted from the digital signal from the phase correcting circuit 10.

The phase correcting circuit 10, in the example shown in FIG. 8, includes phase correcting units 101, 102, . . . and 10m for correcting phase characteristics of the input digital signal Di in accordance with phase characteristics in the m distortion-correcting-component generating units 301, 302, . . . and 30m. The phase correcting units 101, 102, . . . and 10m have transfer functions Ha1, Ha2, . . . and Ham for correcting the phase of the input digital signal Di so that, regardless of normalized frequency, the m n-th harmonic distortions generated in the PWM circuit 5 in relation to the input digital signal Di have opposite phases with respect to the distortion-correcting components Dn1, Dn2, . . . and Dnm supplied via the subtractor circuit 2, respectively, in the PWM circuit 5.

The digital signals Dc1, Dc2, . . . and Dcm from the phase correcting units 101, 102, . . . and 10m, whose phases have been corrected, are supplied to an adder circuit 110. The adder circuit 110 adds the m digital signals Dc1, Dc2, . . . and Dcm to generate a digital signal Dc having corrected amplitude and phase, and supplies the digital signal Dc to the subtractor circuit 2.

In the example shown in FIG. 8, a plurality of n-th order harmonic distortions are removed. Although m distortion-correcting-component generating units 301, 302, . . . and 30m and m phase correcting units 101, 102, . . . and 10m are provided for m n-th harmonic waves in order to remove a plurality of n-th harmonic distortions in the example shown in FIG. 8, the numbers of distortion-correcting-component generating units and phase correcting units need not be m and need not be the same number as long as desired amplitude-phase characteristics are achieved.

Furthermore, although all the embodiments described above have dealt with cases where harmonic distortions generated in a PWM circuit are removed, the present invention can be applied to cases where a PWM signal is supplied from a PWM circuit to an analog filter circuit or a class-D amplifier and a distortion component generated in the analog filter circuit or a distortion component generated by switching of switching elements of the class-D amplifier is to be removed, without limitation to distortions generated by PWM. Furthermore, the present invention can be applied to a case where a distortion component generated by switching, etc. is to be removed in addition to a distortion generated by PWM. In that case, the transfer function He of the distortion-correcting-component generating circuit 3 and the transfer function Ha of the phase correcting circuit 10 are chosen suitably in order to remove those distortion components.

Figure 9:
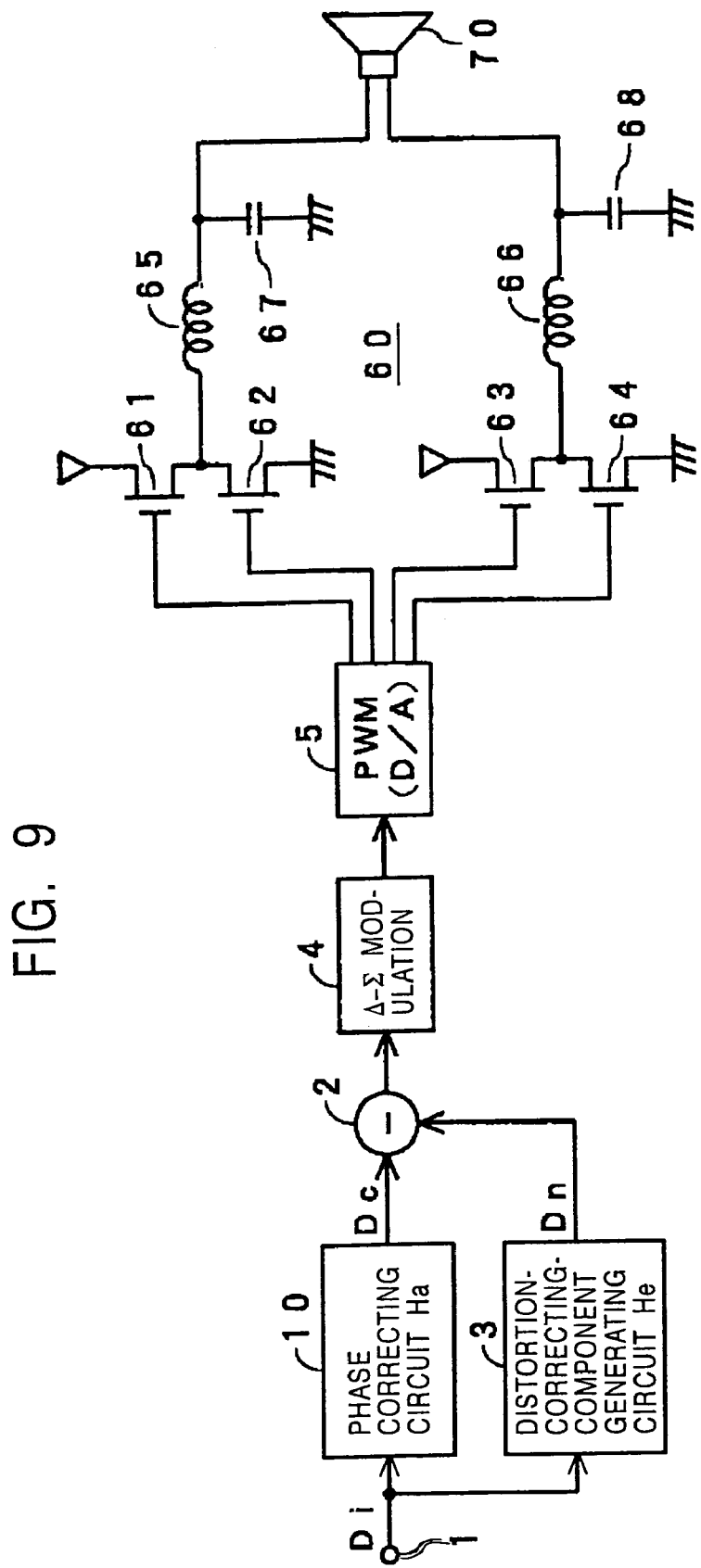
FIG. 9 is a diagram showing an example configuration according to another embodiment of the present invention.

FIG. 9 shows an example configuration that is used in a case where a PWM signal is supplied to a class-D amplifier and a distortion component generated by switching of switching elements of the class-D amplifier is to be removed.

More specifically, in the example shown in FIG. 9, a PWM signal from the PWM circuit 5 is supplied to a speaker 70 via an output amplifier circuit 60 implemented by a class-D amplifier, whereby the speaker 70 is driven to acoustically play back a playback signal obtained by D/A conversion of an input digital audio signal.

The output amplifier circuit 60 implemented by a class-D amplifier includes four FETs 61, 62, 63 and 64 that are connected in a so-called BTL arrangement. Switching of the four FETs 61 to 64 is controlled according to a PWM signal from the PWM circuit 5.

In the example shown in FIG. 9, switching is controlled according to the PWM signal from the PWM circuit 5 so that when the FET 61 is turned on, the FET 64 is turned on and the FETs 62 and 63 are turned off, and so that when the FET 62 is turned on, the FET 63 is turned on and the FETs 61 and 64 are turned off. The PWM circuit 5 outputs normal-phase and reverse-phase PWM signals, for example, as shown in FIG. 3.

A coil 65 and a capacitor 67, and a coil 66 and a capacitor 68, form smoothing circuits, respectively. A driving current flows through a coil of the speaker 70 via the smoothing circuits according to switching of the FETs 61 to 64, whereby a sound is played back.

The switching of the FETs 61 to 64 according to the PWM signal causes a switching distortion. The transfer functions Ha and He of the phase correcting circuit 10 and the distortion-correcting-component generating circuit 3 are chosen so that the switching distortion will be removed.

In the example shown in FIG. 9, even in a case where normalized frequency is inevitably high, such as in a case where a PWM signal is supplied to a speaker via an output amplifier circuit implemented by a class-D amplifier, a distortion caused by switching of switching elements according to the PWM signal is favorably cancelled.

Although the embodiments have been described above in the context of examples where input digital signals are digital audio signals, it is to be understood that the present invention is not limited to applications to digital audio signals.

As described hereinabove, according to the present invention, by controlling phase characteristics of an input digital signal in accordance with phase characteristics of a distortion component, which has not been considered in the related art, a distortion caused by PWM, etc. is favorably cancelled regardless of normalized frequency.

The invention claimed is:

1. A digital/analog converter comprising:
   a pulse-width-modulated-signal outputting circuit for outputting a pulse-width-modulated signal having a pulse width in accordance with a digital value of an input digital signal;
   a correcting-component generating circuit for generating, from the input digital signal, at least a correcting component corresponding to a distortion component generated in the pulse-width-modulated-signal outputting circuit;
   a subtractor circuit disposed upstream of the pulse-width-modulated-signal outputting circuit, for subtracting, from the input digital signal, the correcting component generated by the correcting-component generating circuit; and
   a phase correcting circuit for correcting phase characteristics of the input digital signal so that the distortion component and the correcting component have a phase difference such that these components have opposite phases in the pulse-width-modulated-signal outputting circuit.

2. A digital/analog converter according to claim 1, further comprising a circuit disposed upstream of the pulse-width-modulated-signal outputting circuit, for outputting a digital signal having a smaller number of bits than a number of bits of the input digital signal.

3. A digital/analog converter according to claim 1,
   wherein the correcting-component generating circuit serves to remove a second harmonic distortion of a playback signal that is to be obtained by digital/analog conversion, the second harmonic distortion being generated in the pulse-width-modulated-signal outputting circuit,
   and wherein the phase correcting circuit comprises a delaying circuit for delaying the input digital signal by one sample.

4. A digital/analog converter according to claim 1,
   wherein the correcting-component generating circuit comprises a plurality of harmonic-correcting-component generating circuits for generating correcting components corresponding to harmonic distortion components of a plurality of orders, generated in the pulse-width-modulated-signal outputting circuit,
   and wherein the phase correcting circuit comprises a plurality of harmonic phase correcting circuits for performing correction so that the harmonic distortion components generated in the pulse-width-modulated-signal outputting circuit and outputs of the harmonic-correcting-component generating circuits have phase differences such that the harmonic distortion components have opposite phases from the outputs of the harmonic-correcting-component generating circuits, respectively.

5. A digital signal processing apparatus comprising:
a pulse-width-modulated-signal outputting circuit for outputting a pulse-width-modulated signal having a pulse width in accordance with a digital value of an input digital signal;
an amplifier circuit disposed on an output side of the pulse-width-modulated-signal outputting circuit, the amplifier circuit including a plurality of switching elements;
a correcting-component generating circuit for generating, from the input digital signal, at least a correcting component corresponding to a distortion component generated in the amplifier circuit by switching of the plurality of switching elements according to the pulse-width-modulated signal;
a subtractor circuit disposed upstream of the pulse-width-modulated-signal outputting circuit, for subtracting, from the input digital signal, the correcting component generated by the correcting-component generating circuit; and
a phase correcting circuit for correcting phase characteristics of the input digital signal so that the distortion component and the correcting component have a phase difference such that they have opposite phases in the pulse-width-modulated-signal outputting circuit.

6. A digital signal processing method comprising:
generating a correcting component corresponding to a distortion component generated in a pulse-width-modulated-signal outputting circuit for outputting a pulse-width-modulated signal having a pulse width in accordance with a digital value of an input digital signal, and subtracting the correcting component from the input digital signal upstream of the pulse-width-modulated-signal outputting circuit; and
correcting phase characteristics of the input digital signal so that the distortion component and the correcting component have a phase difference such that they have opposite phases in the pulse-width-modulated-signal outputting circuit.

7. A digital signal processing method for driving a plurality of switching elements that comprise an output amplifier circuit, by a pulse-width-modulated signal having a pulse width in accordance with a digital value of an input digital signal, the method comprising:
generating, from the input digital signal, at least a correcting component, corresponding to a distortion component generated in the output amplifier circuit by switching of the plurality of switching elements according to the pulse-width-modulated signal, and subtracting the correcting component from the input digital signal upstream of a signal processing circuit; and
correcting phase characteristics of the input digital signal so that the distortion component and the correcting component have a phase difference such that they have opposite phases in the pulse-width-modulated-signal outputting circuit.

* * * * *